(12) United States Patent
Hisamoto et al.

(10) Patent No.: US 11,342,430 B2
(45) Date of Patent: May 24, 2022

(54) SEMICONDUCTOR DEVICE

(71) Applicant: RENESAS ELECTRONICS CORPORATION, Tokyo (JP)

(72) Inventors: Digh Hisamoto, Tokyo (JP); Yoshiyuki Kawashima, Tokyo (JP); Takashi Hashimoto, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 17/084,097

(22) Filed: Oct. 29, 2020

(65) Prior Publication Data

US 2021/0143260 A1 May 13, 2021

(30) Foreign Application Priority Data

Nov. 13, 2019 (JP) .............................. JP2019-205649

(51) Int. Cl.
| | |
|---|---|
| *H01L 29/423* | (2006.01) |
| *H01L 21/28* | (2006.01) |
| *H01L 29/10* | (2006.01) |
| *H01L 29/78* | (2006.01) |
| *H01L 29/792* | (2006.01) |
| *H01L 27/11568* | (2017.01) |

(52) U.S. Cl.
CPC .... *H01L 29/42344* (2013.01); *H01L 29/1045* (2013.01); *H01L 29/40117* (2019.08); *H01L 29/7855* (2013.01); *H01L 29/792* (2013.01); *H01L 27/11568* (2013.01)

(58) Field of Classification Search
CPC ......... H01L 29/42344; H01L 29/40117; H01L 29/7855; H01L 29/792; H01L 29/66833; H01L 29/66795; H01L 29/785
See application file for complete search history.

(56) References Cited

U.S. PATENT DOCUMENTS

| | | | |
|---|---|---|---|
| 10,043,814 B2 | 8/2018 | Yamashita | |
| 2004/0238878 A1 | 12/2004 | Sato et al. | |
| 2005/0230736 A1* | 10/2005 | Ishimaru | ........... H01L 29/66833 257/314 |

(Continued)

FOREIGN PATENT DOCUMENTS

| | | |
|---|---|---|
| EP | 3 454 377 A1 | 3/2019 |
| JP | 2017-045860 A | 3/2017 |

OTHER PUBLICATIONS

European Search Report issued in corresponding European Patent Application No. 20207301.1-1212, dated Mar. 30, 2021.

*Primary Examiner* — Mohammed R Alam

(74) *Attorney, Agent, or Firm* — McDermott Will & Emery LLP

(57) ABSTRACT

A semiconductor device has a split-gate type MONOS structure using a FinFET, and it includes a source and a drain each formed of an n-type impurity diffusion layer, a first channel forming layer which is formed under a control gate and is formed of a semiconductor layer doped with a p-type impurity, and a second channel forming layer which is formed under a memory gate and is formed of a semiconductor layer doped with an n-type impurity. Further, the semiconductor device includes a p-type semiconductor layer which is formed under the second channel forming layer and has an impurity concentration higher than an impurity concentration of a semiconductor substrate.

8 Claims, 27 Drawing Sheets

(56) References Cited

U.S. PATENT DOCUMENTS

| | | | |
|---|---|---|---|
| 2006/0044873 A1* | 3/2006 | Katayama | H01L 27/115 365/185.18 |
| 2011/0129984 A1* | 6/2011 | Funayama | H01L 21/823456 438/424 |
| 2018/0097007 A1 | 4/2018 | Tsukuda et al. | |

* cited by examiner

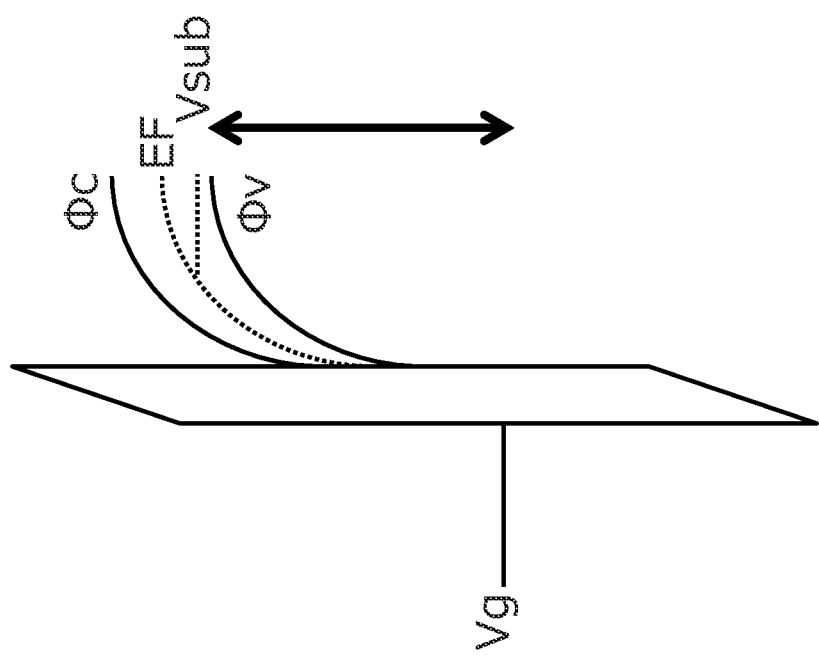

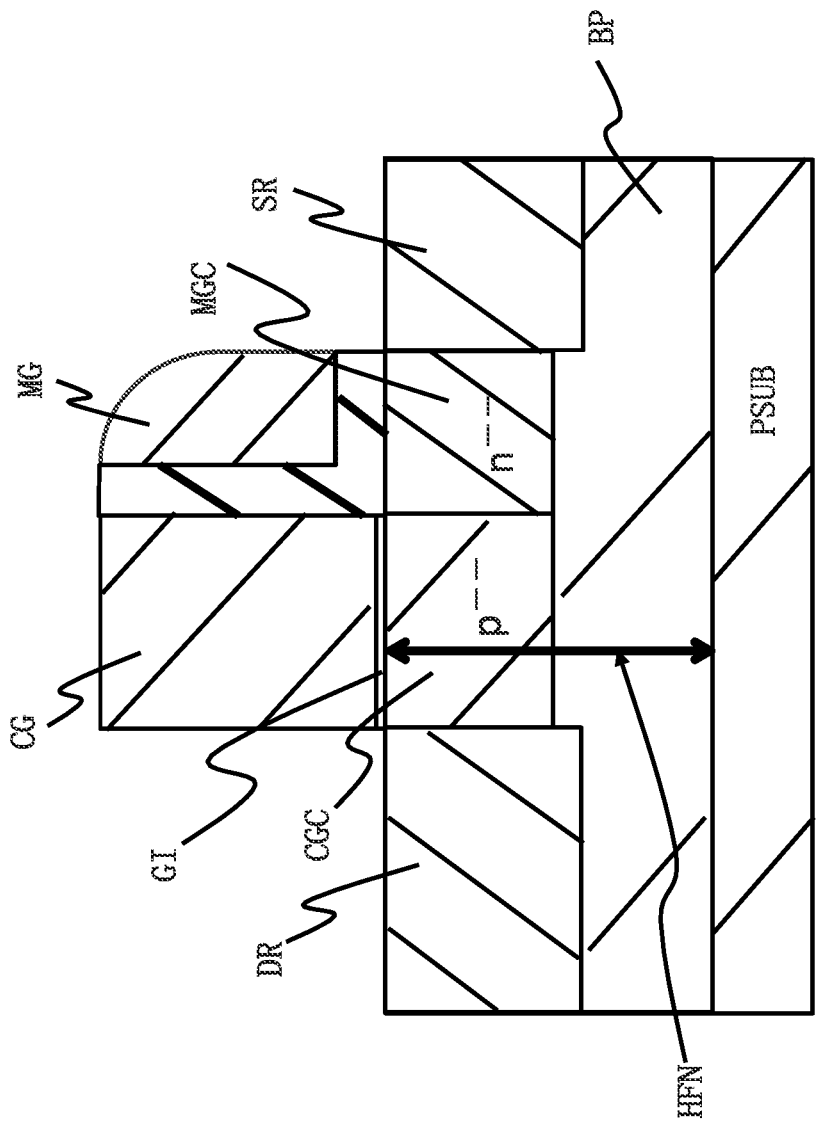

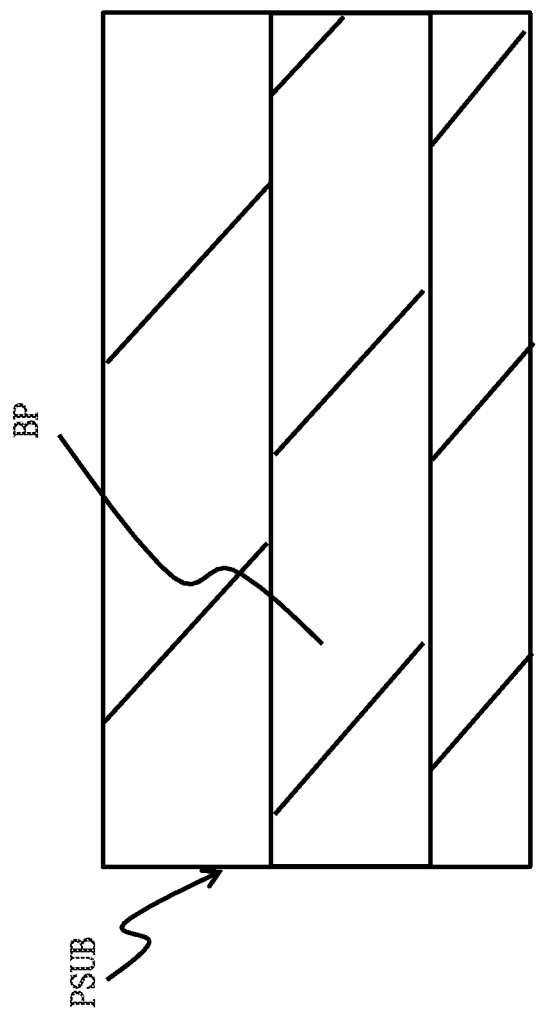

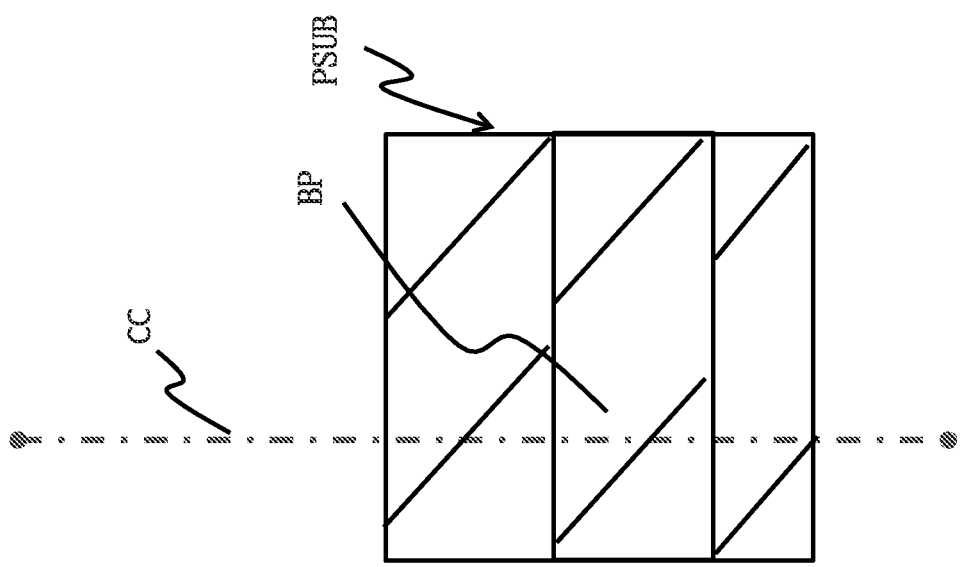

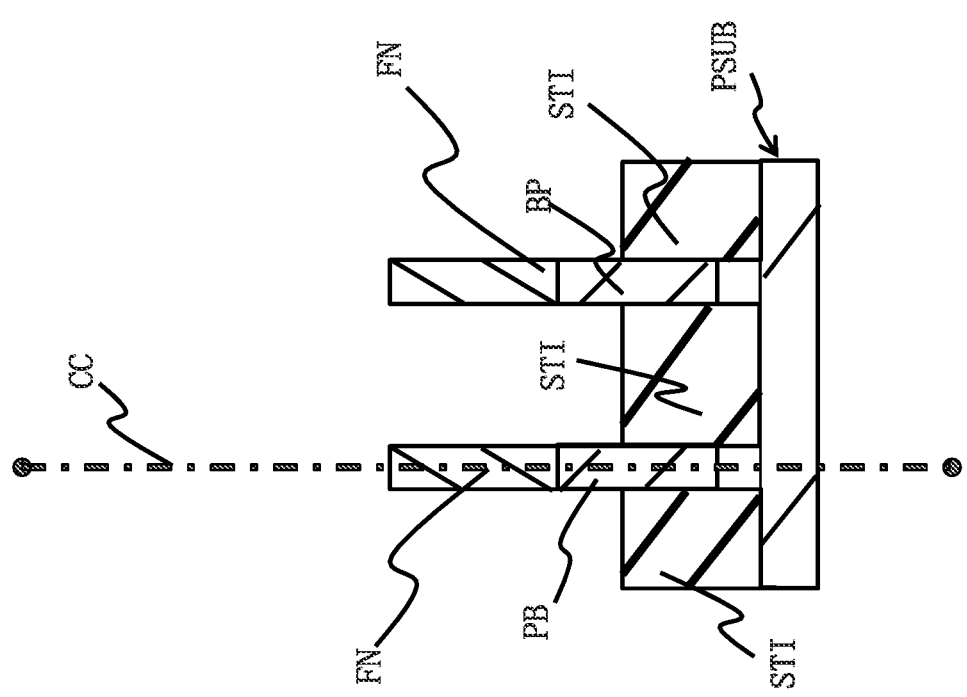

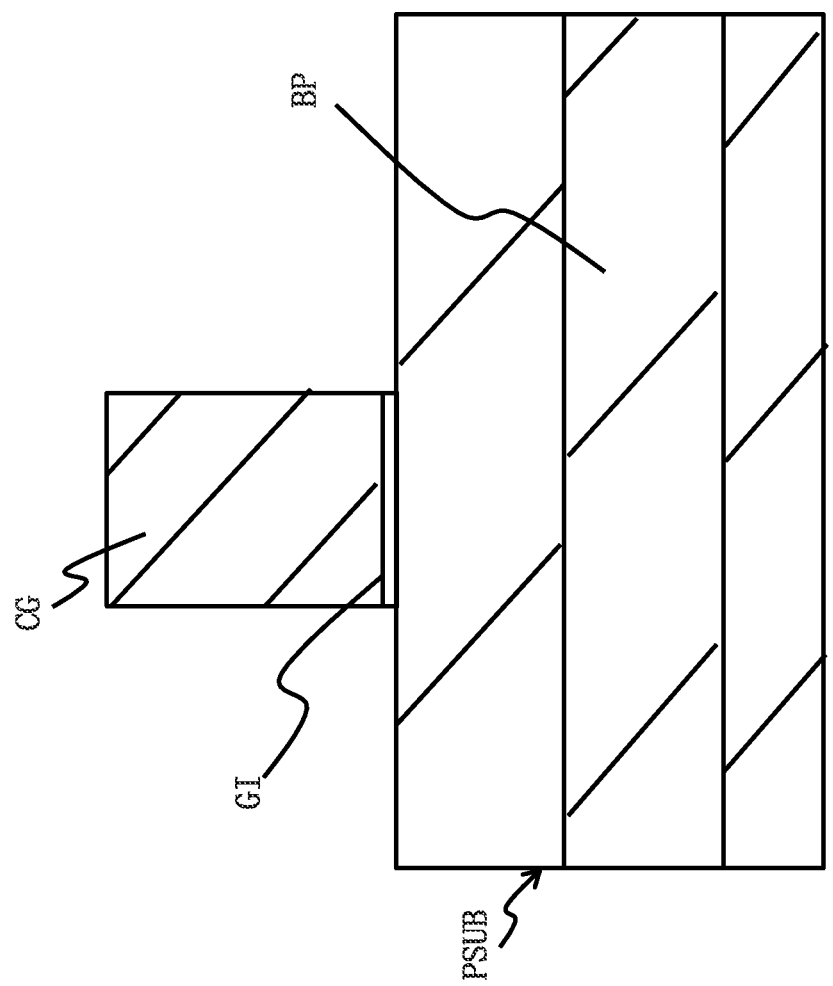

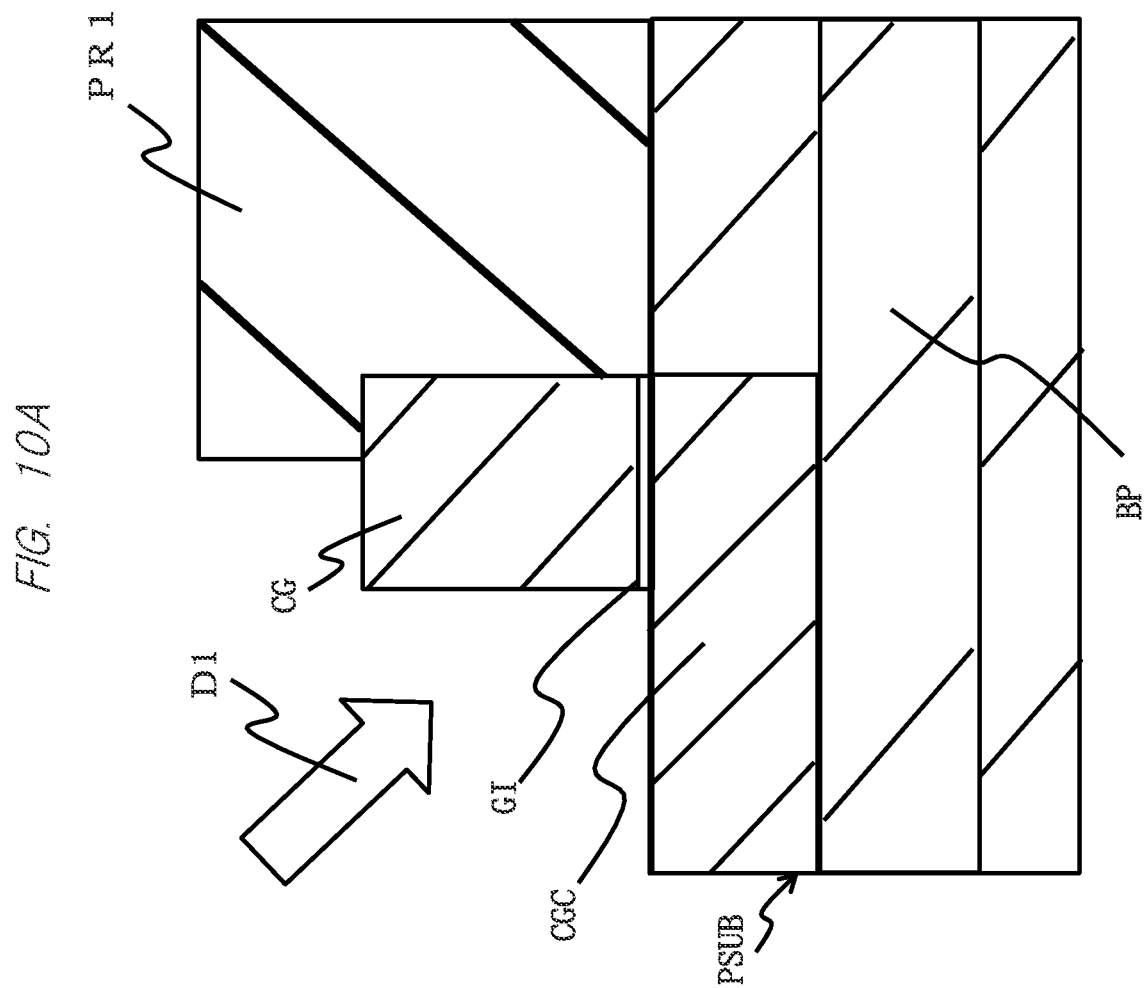

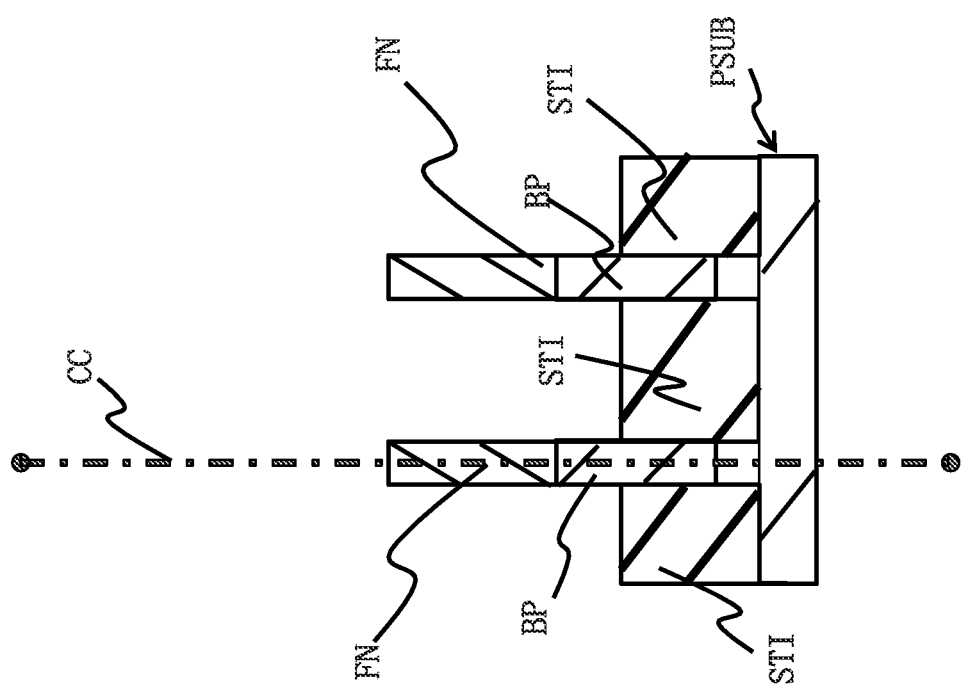

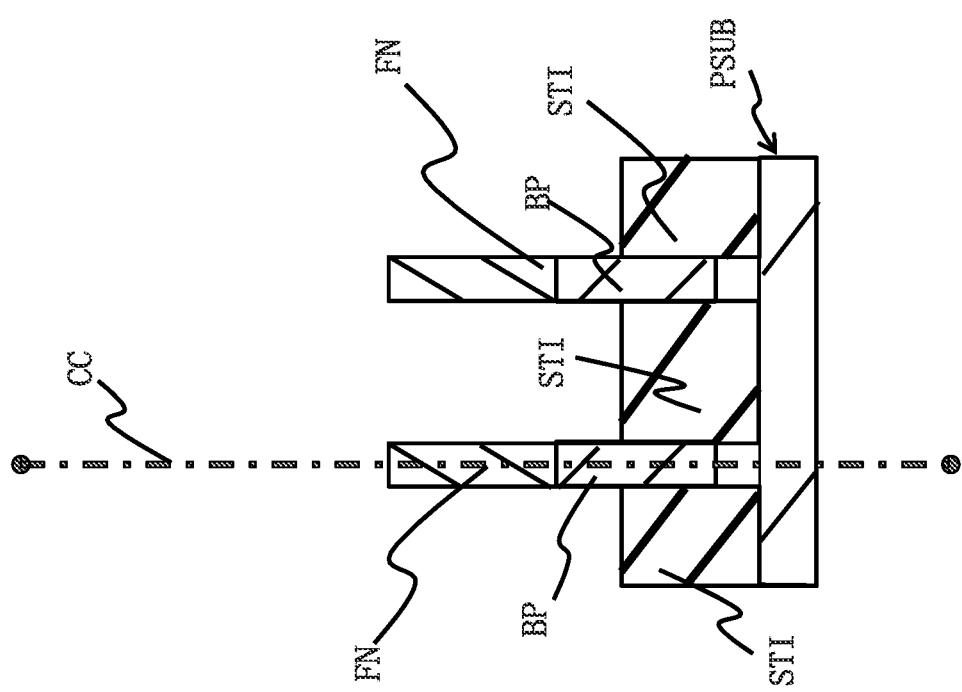

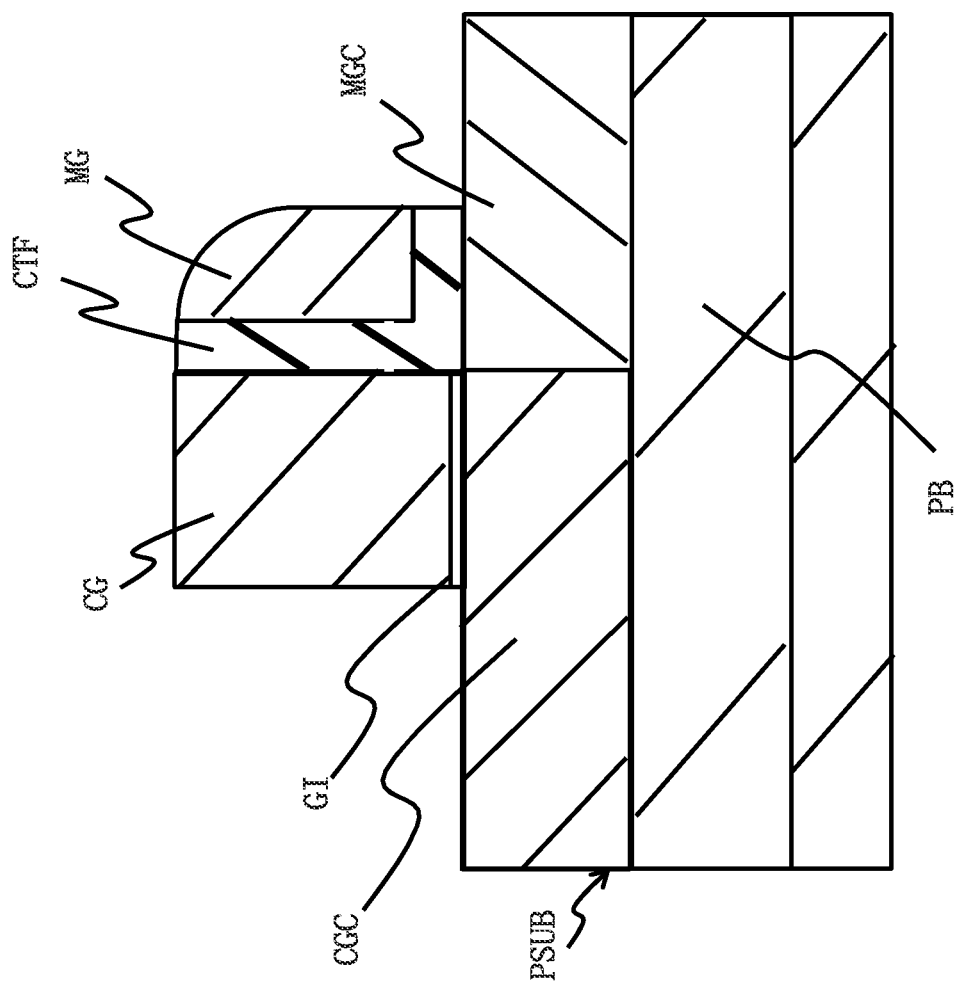

| | VBL | VWL | VMG | VSL | VB |
|---|---|---|---|---|---|
| Erase | GND | Vcge | Vmge | Vse | GND |
| Program | GND/Vcc | Vcgp | Vmgp | Vsp | GND |
| Read | Vcc | Vcc | GND | GND | GND |

B:

| | VBL | VWL | VMG | VSL | VB |
|---|---|---|---|---|---|
| Erase | 0 | 0 | -5 | 5 | 0 |
| Program | 0/1.5 | 0.5 | 10 | 5 | 0 |
| Read | 1.5 | 1.5 | 0 | 0 | 0 |

SEMICONDUCTOR DEVICE

CROSS-REFERENCE TO RELATED APPLICATION

The disclosure of Japanese Patent Application No. 2019-205649 filed on Nov. 13, 2019 including the specification, drawings and abstract is incorporated herein by reference in its entirety.

TECHNICAL FIELD OF THE INVENTION

The present invention relates to a semiconductor device, and particularly relates to a technology suitably applied to a semiconductor device including a transistor with fin structure (FinFET: Fin Field Effect Transistor).

BACKGROUND OF THE INVENTION

Flash memories have been widely used as electrically writable and erasable non-volatile memories. These storage devices have a charge trapping insulating film under the gate electrode of the MISFET (Metal Insulator Semiconductor Field Effect Transistor), and are configured to use the charge accumulation state in the charge trapping insulating film as storage information and read out it as the threshold of the transistor. The charge trapping insulating film mentioned here is an insulating film capable of accumulating charges, and examples thereof include a silicon nitride film. The MISFET can be used as a non-volatile memory by shifting the threshold of the MISFET by the injection and emission of the charges into and from the charge accumulation film like this. This flash memory is referred to also as MONOS (Metal Oxide Nitride Oxide Semiconductor) transistor.

Also, the split-gate type memory cell using the MONOS transistor as a memory transistor and further added with a control transistor has been widely used. In addition, the FinFET has been known as a field effect transistor capable of achieving the increase in operation speed, the reduction in leakage current and power consumption, and the miniaturization of semiconductor elements. The FinFET is, for example, a semiconductor element configured to have a semiconductor layer protruding on a semiconductor substrate as a channel region and a gate electrode formed so as to straddle the protruding semiconductor layer. Japanese Unexamined Patent Application Publication No. 2017-45860 (Patent Document 1) discloses an example of the FinFET.

SUMMARY OF THE INVENTION

First, the feature in the operation of the FinFET will be described. The feature of the FinFET lies in having the double-gate structure in which the gates are arranged on both sides of the fin serving as the channel. Therefore, it has a flat potential distribution in the channel. FIG. 1A shows the potential distribution of the FinFET in the channel depth direction, and FIG. 1B shows the potential distribution of a normal planar type MOSFET in the channel depth direction. Note that FIG. 1A and FIG. 1B simulatively show the potential distributions in the case where both FETs are N-type MOSFETs.

The potential distribution is formed by the bias applied between the substrate and the gate. This potential distribution depends on the impurity concentration doped to the channel. For suppressing the characteristic deterioration due to the short channel effect, it is necessary to increase the impurity concentration of the channel, and thus the potential distribution becomes steep in the normal planar type MOSFET as shown in FIG. 1B. Namely, the difference between the gate potential Vg and the substrate potential Vsub is large.

On the other hand, as shown in FIG. 1A, the gate electrodes with the same potential are arranged on both sides of the fin in the FinFET, and the surfaces on both sides of the channel have the same potential. Therefore, the difference between the gate potential Vg and the substrate potential Vsub is small. In the FinFET, the short channel effect can be suppressed by this double gate structure, and thus the impurity concentration can be kept low. Accordingly, the potential distribution in the channel is almost flat as schematically shown in FIG. 1A, that is, the vertical electric field can be made extremely small.

When the transistor operation is taken into account, many advantages such as high inversion layer mobility and reduction in noise can be obtained by the weak vertical electric field, and it is thought that this is the reason why the FinFET has been adopted as the standard device structure. Note that the reference signs $\phi C$, $\phi V$, and EF in FIG. 1A and FIG. 1B indicate conduction band, valence band, and Fermi level in the energy band.

On the other hand, in the split-gate type memory having the charge trapping insulating film, the charge injection and the charge extraction to and from the charge retaining portion are performed by using the vertical electric field at the time of writing and erasing. Therefore, the problem of the deterioration in writing efficiency and erasing efficiency occurs if the vertical electric field is low.

A structure of a memory cell MC of a MONOS transistor will be described below with reference to FIG. 2. The memory cell MC includes a control gate CG used as a word line WL, a memory gate MG used as a writing and erasing electrode, a drain DR arranged on the side of the control gate CG and formed of an $n^+$-type diffusion layer, and a source SR arranged on the side of the memory gate MG and formed of an $n^+$-type diffusion layer. The control gate CG controls a channel forming layer CGC under the control gate CG which is formed in a surface of a p-type substrate PSUB by the field effect via a gate insulating film GI, and the memory gate MG controls a channel MGC under the memory gate MG via a charge trapping film CTF.

Also, a predetermined potential is supplied to each of the drain DR, the source SR, the p-type substrate PSUB, and the memory gate MG via a bit line BL, a source line SL, a substrate potential line VSUB, and a sub-word line SWL. Generally, the names of source and drain are used depending on the flow direction of channel carrier, but since the split-gate type MONOS has an asymmetric structure, the names of source and drain are used as electrode names of specific diffusion layers for convenience. Therefore, the carrier may flow from the drain electrode to the source electrode depending on the operation mode.

In the split-gate type MONOS, electrons are injected into the charge trapping film by the vertical electric field by using the SSI (Source Side Injection) in the writing. In the erasing, holes are injected into the charge trapping film by accelerating the holes generated by the band to band tunneling at the end of the diffusion layer (source), by the horizontal electric field of the MG channel. Therefore, the low vertical electric field in the channel has the worst effect on the writing characteristics.

As described above, an important issue when the split-gate type MONOS is formed by using the FinFET is to improve the writing characteristics.

Other problems and novel features will be apparent from the descriptions of the specification and drawings.

A semiconductor device according to one embodiment has a split-gate type MONOS structure using a FinFET, and it includes a source and a drain each formed of an n-type impurity diffusion layer, a first channel forming layer which is formed under a control gate and is formed of a semiconductor layer doped with a p-type impurity, and a second channel forming layer which is formed under a memory gate and is formed of a semiconductor layer doped with an n-type impurity. Further, the semiconductor device includes a p-type semiconductor layer which is formed under the second channel forming layer and has an impurity concentration higher than an impurity concentration of a semiconductor substrate.

By the semiconductor device according to the embodiment, it is possible to improve the writing characteristics of the split-gate type MONOS using a FinFET.

BRIEF DESCRIPTIONS OF THE DRAWINGS

FIG. 1B is a potential distribution diagram in a planar type MOSFET structure studied by the inventors;

FIG. 5A is a cross-sectional view showing a principal part of a unit cell UC corresponding to a line A-A in FIG. 4;

FIG. 7A is a cross-sectional view showing a principal part in the manufacturing process of the split-gate type MONOS using the FinFET according to the embodiment;

FIG. 7B is a cross-sectional view showing a principal part in the manufacturing process of the split-gate type MONOS using the FinFET according to the embodiment;

FIG. 8B is a cross-sectional view showing a principal part in the manufacturing process of the split-gate type MONOS using the FinFET following FIG. 7B;

FIG. 9A is a cross-sectional view showing a principal part in the manufacturing process of the split-gate type MONOS using the FinFET following FIG. 8A;

FIG. 10A is a cross-sectional view showing a principal part in the manufacturing process of the split-gate type MONOS using the FinFET following FIG. 9A;

FIG. 10B is a cross-sectional view showing a principal part in the manufacturing process of the split-gate type MONOS using the FinFET following FIG. 9B;

FIG. 11B is a cross-sectional view showing a principal part in the manufacturing process of the split-gate type MONOS using the FinFET following FIG. 10B;

FIG. 12A is a cross-sectional view showing a principal part in the manufacturing process of the split-gate type MONOS using the FinFET following FIG. 11A;

FIG. 17 is a bias condition diagram showing an example of the conditions of the bias applied during the operation of the split-gate type MONOS using the FinFET according to the embodiment.

DESCRIPTIONS OF THE PREFERRED EMBODIMENTS

The semiconductor device according to the embodiment will be described in detail with reference to drawings. Note that the same components or corresponding components are denoted by the same reference signs in the specification and the drawings, and the repetitive description thereof will be omitted. Also, the embodiment and each modification may be combined with each other at least partially as appropriate. Further, the diagonal lines indicating that the section is not hollow in the cross-sectional views may be omitted in some cases for making the drawings easy to see. If the section is hollow, the fact that the section is hollow is apparently described in the specification.

The signs "−" and "+" indicate relative concentration of the impurity of n conductivity type or p conductivity type. For example, in the case of an n-type impurity, the impurity concentration becomes higher in the order of "$n^{--}$", "$n^{-}$", "n", "$n^{+}$", and "$n^{++}$".

(First Embodiment)

The semiconductor device according to the first embodiment will be described with reference to FIG. 3 to FIG. 5. First, a typical operation in the case where a non-volatile memory array is configured by using a semiconductor device having a split-gate type MONOS structure will be described. In the split-gate type MONOS structure, a split-gate structure including at least a control gate CG and a memory gate MG is adopted.

Figure 3:
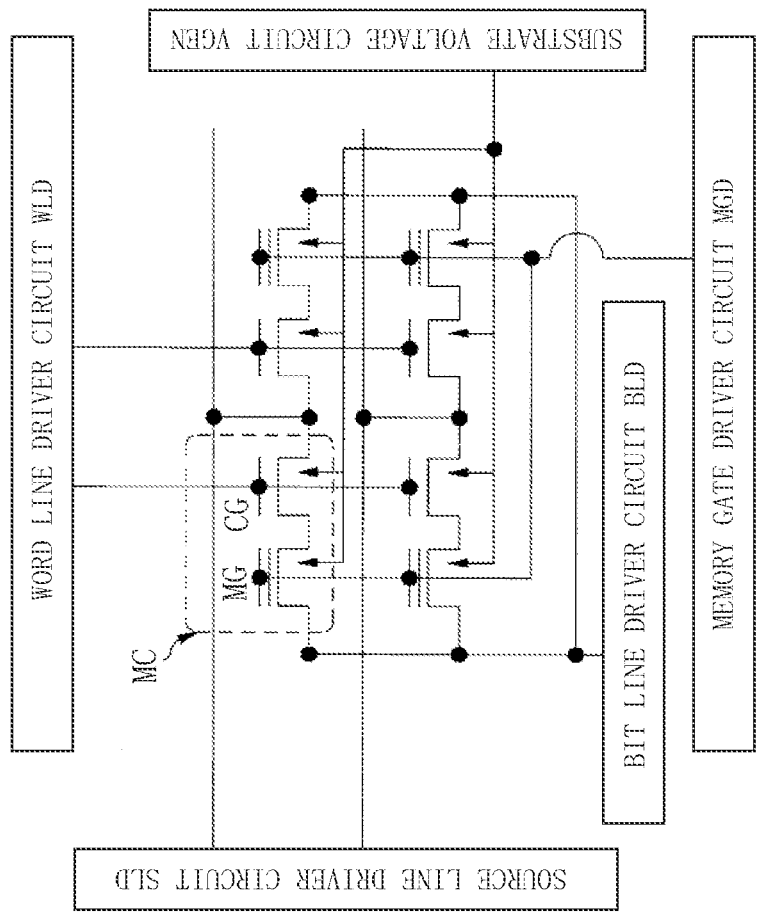
FIG. 3 is a circuit diagram showing a memory module configuration according to an embodiment.

FIG. 3 shows a typical array configuration. FIG. 3 shows an example of a non-volatile memory module and is an equivalent circuit diagram showing a connection relationship of four memory cells MC of a plurality of memory cells MC. Each control gate CG is electrically connected to a word line driver circuit WLD for control gate CG, each memory gate MG is electrically connected to a memory gate driver circuit MGD for memory gate MG, a source SR is electrically connected to a source line driver circuit SLD for source line, and a drain DR is electrically connected to a bit line driver circuit BLD for bit line. Also, a predetermined potential is applied to a semiconductor substrate PSUB by a substrate voltage circuit VGEN.

Figure 1A:
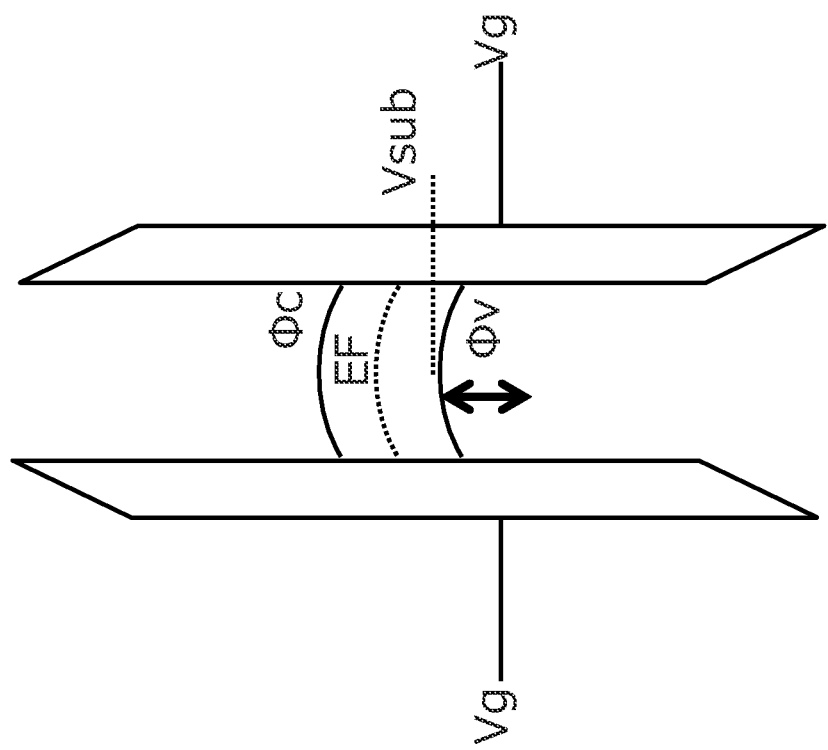
FIG. 1A is a potential distribution diagram in a FinFET structure studied by the inventors.
Figure 2:
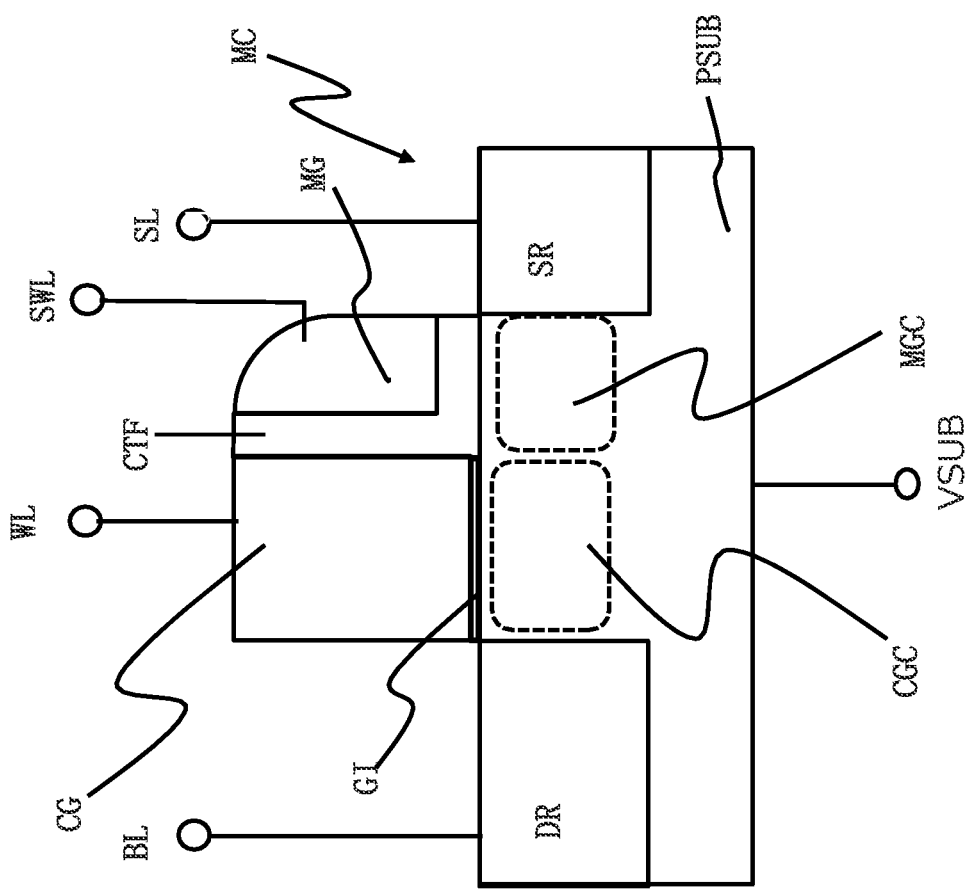
FIG. 2 is a cross-sectional view showing a principal part of a split-gate type MONOS memory cell studied by the inventors.
Figure 4:
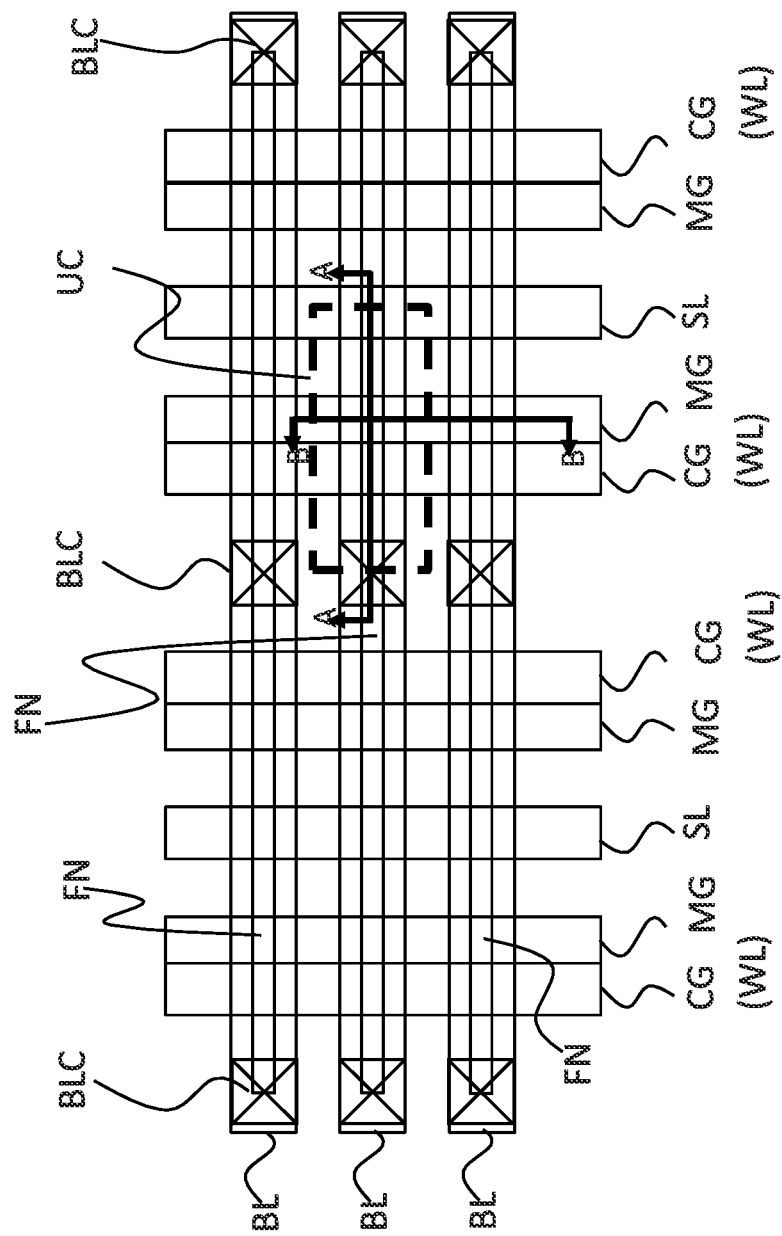
FIG. 4 is a planar layout diagram showing a split-gate type MONOS using a FinFET according to the embodiment.

FIG. 4 shows an example of a planar layout of a memory cell array shown in FIG. 3. In FIG. 4, a part surrounded by a dotted line is a unit cell UC, and a cross-sectional structure along a line A-A including a fin FN is shown in FIG. 2. For describing the operation of the memory cell MC in the split-gate type MONOS structure, the operation of the memory cell in the case where the selection transistor is an NMOS will be described. In the memory cell in the case where the selection transistor is a PMOS, the same effect as the case of the above-mentioned NMOS can be obtained by inverting the positive and negative signs for the bias conditions.

FIG. 17 shows an operation mode of the typical memory cell MC having the split-gate type MONOS structure shown in FIG. 2. The bias conditions at the terminals in the respective operations are shown by signs such as a ground potential GND and a power supply voltage Vcc in the upper table A of FIG. 17, and are shown by specific voltage (unit: V) examples in the device assuming the voltage of 1.5 V in the lower table B of FIG. 17. Since the writing uses the source side injection method and hot carrier electrons generated in the channel are injected into the charge trapping film, the channel of the selection transistor and the memory transistor is brought into an on state and a high memory gate voltage VMG is applied.

On the other hand, since holes are generated by the band to band tunnel phenomenon in the electric field between the source line SL and the memory gate MG in the erasing, a negative memory gate voltage VMG is applied. The generated holes are accelerated by the electric field to inject them into the charge trapping film, thereby performing the erasing. In the reading operation, the selection transistor is brought into an on state by setting the source line SL to the ground potential, setting the bit line BL to the power supply voltage, and applying the power supply voltage to the control gate CG, and the operation of the non-volatile memory cell MC is obtained by reading the charge trapping state of the memory gate MG as a magnitude of the current value.

Figure 5B:
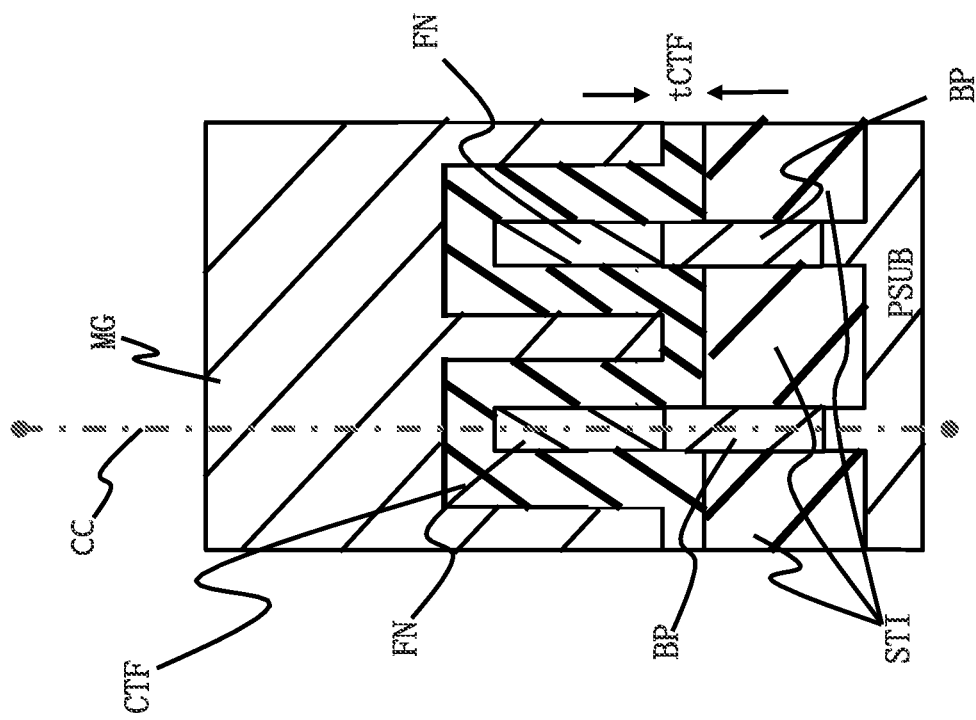
FIG. 5B is a cross-sectional view showing a principal part of the unit cell UC corresponding to a line B-B in FIG. 4.

Next, the structure of the typical memory cell MC according to the first embodiment will be described with reference to FIG. 5A and FIG. 5B. FIG. 5A corresponds to the A-A cross section in FIG. 4 and FIG. 5B corresponds to the B-B cross section in FIG. 4. In the cell structure shown in FIG. 2, the channel forming layer MGC formed in the fin FN is formed of an n-type impurity doped layer and a p-type semiconductor layer BP (buried type) formed of a p-type impurity doped layer is provided under the channel forming layer MGC. The impurity concentration of the p-type semiconductor layer BP is set to be higher than the impurity concentration of the semiconductor substrate. It is preferable that the impurity concentration of the p-type semiconductor layer BP is set to be higher than the impurity concentration of the channel forming layer CGC.

Figure 6:
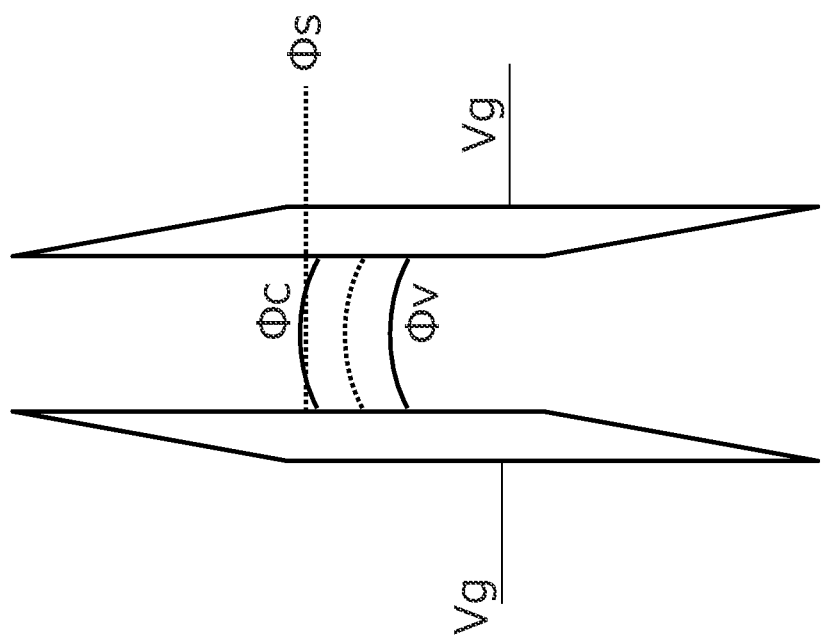
FIG. 6 is a band diagram showing a potential distribution of a channel forming layer in the writing operation of the split-gate type MONOS using the FinFET according to the embodiment.

FIG. 6 shows the potential distribution of the channel forming layer MGC when the writing operation is performed in this channel structure. It can be seen that since the channel forming layer MGC is formed of an n-type semiconductor layer, sufficient carrier accumulation occurs when the conduction band φC is bent to reach the source potential φS by the field effect, so that the bias applied to the memory gate MG turns to be applied to the gate insulating film which is the charge trapping film CTF and a high electric field is generated. At this time, when viewed in the cross-sectional structure including the fin FN, since the source potential φS permeates into the channel forming layer MGC, a high electric field is generated at the PN junction formed at the boundary between the channel forming layer CGC and the channel forming layer MGC due to the potential difference between the drain DR and the source SR. Therefore, electrons can be efficiently injected into the charge trapping film CTF.

Next, the manufacturing method of the semiconductor device according to the first embodiment will be described with reference to FIG. 7 to FIG. 15. Here, the manufacturing method will be simply described in order to clarify the basic arrangement relationship of the respective impurity doped layers formed in the fin FN and the semiconductor substrate PSUB to be the important point.

FIG. 7A corresponds to the A-A cross section in FIG. 4 and FIG. 7B corresponds to the B-B cross section in FIG. 4. Therefore, FIG. 7A shows the cross-sectional structure in the case where the structure shown in FIG. 7B is cut by the one-dot chain line CC shown in FIG. 7B in the depth direction of the page of FIG. 7B. The relationships of FIG. 8A and FIG. 8B to FIG. 13A and FIG. 13B described later are the same as the relationship of FIG. 7A and FIG. 7B.

First, as shown in FIG. 7A and FIG. 7B, a p-type impurity (for example, boron) is doped into the semiconductor substrate PSUB made of silicon in the region where the fin is to be formed, by using the normal ion implantation method, thereby forming the p-type semiconductor layer BP having an impurity concentration of, for example, $2\times10^{18}$ cm$^{-3}$.

Figure 8A:
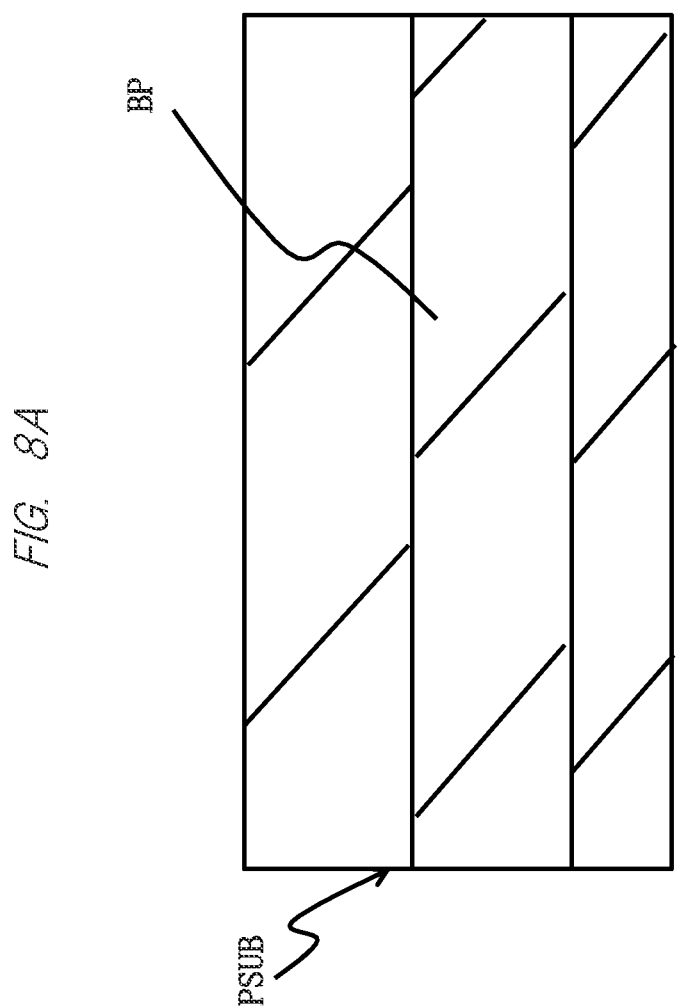
FIG. 8A is a cross-sectional view showing a principal part in the manufacturing process of the split-gate type MONOS using the FinFET following FIG. 7A.

Next, as shown in FIG. 8A and FIG. 8B, the fins FN protruding upward from a shallow trench isolation STI are formed. The fins FN are formed by, for example, forming fin-shaped silicon layers by removing the surface of the semiconductor substrate PSUB by selective etching, depositing an oxide film of about 400 nm on the upper surface of the semiconductor substrate PSUB including the spaces between the fin-shaped silicon layers, planarizing the oxide film by the CMP (Chemical Mechanical Polishing) method, and then etching back the upper surface of the oxide film. The oxide film formed so as to fill the space between the fins FN by the etch back serves as the shallow trench isolation STI.

Figure 9B:
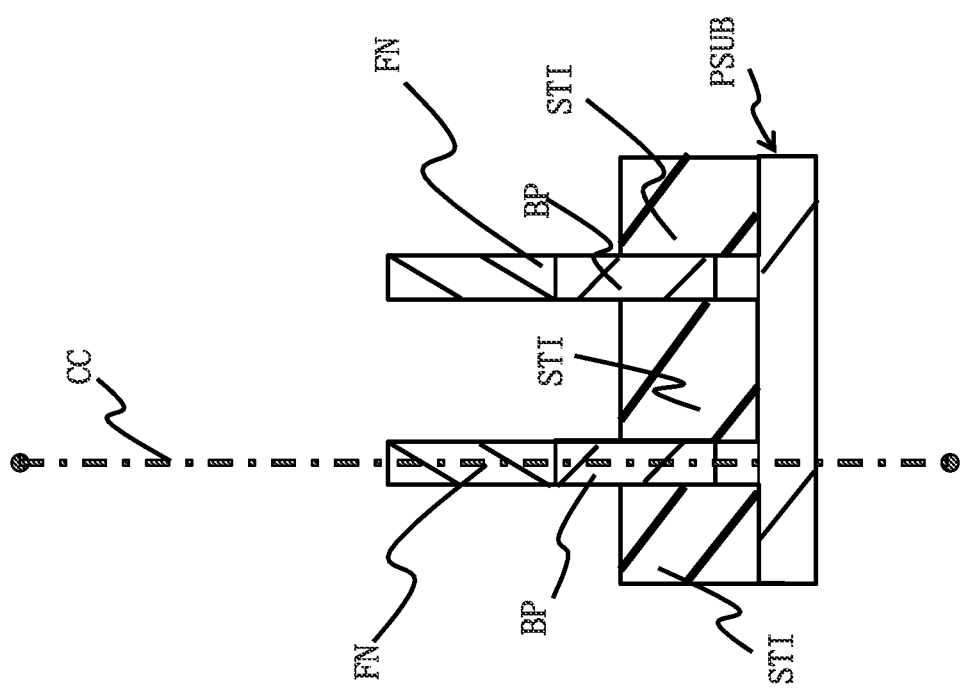
FIG. 9B is a cross-sectional view showing a principal part in the manufacturing process of the split-gate type MONOS using the FinFET following FIG. 8B.

Next, as shown in FIG. 9A and FIG. 9B, the gate insulating film GI formed of, for example, an oxide film is formed on the exposed surface of the fin FN, a polycrystalline silicon film is deposited on the gate insulating film GI, and the polycrystalline silicon film is patterned by the selective etching, thereby forming the control gate CG. The control gate CG is processed so as to have the planar pattern of CG (WL) shown in FIG. 4. In addition, a so-called High-K film such as an HfO can be used as the material of the gate insulating film GI. Further, for achieving the resistance reduction, the threshold adjustment, and the work function control, a metal material such as TaN and Al can be used as the material of the control gate CG.

Next, as shown in FIG. 10A, a photoresist mask PR1 is formed so as to cover the regions to be the memory gate MG and the source SR, and boron is ion-implanted into the main surface of the semiconductor substrate from the diagonal direction D1 with using the control gate CG and the photoresist mask PR1 as a mask, thereby forming the p-type channel forming layer CGC with an impurity concentration of $8 \times 10^{17}$ cm$^{-3}$ under the control gate CG.

Figure 11A:
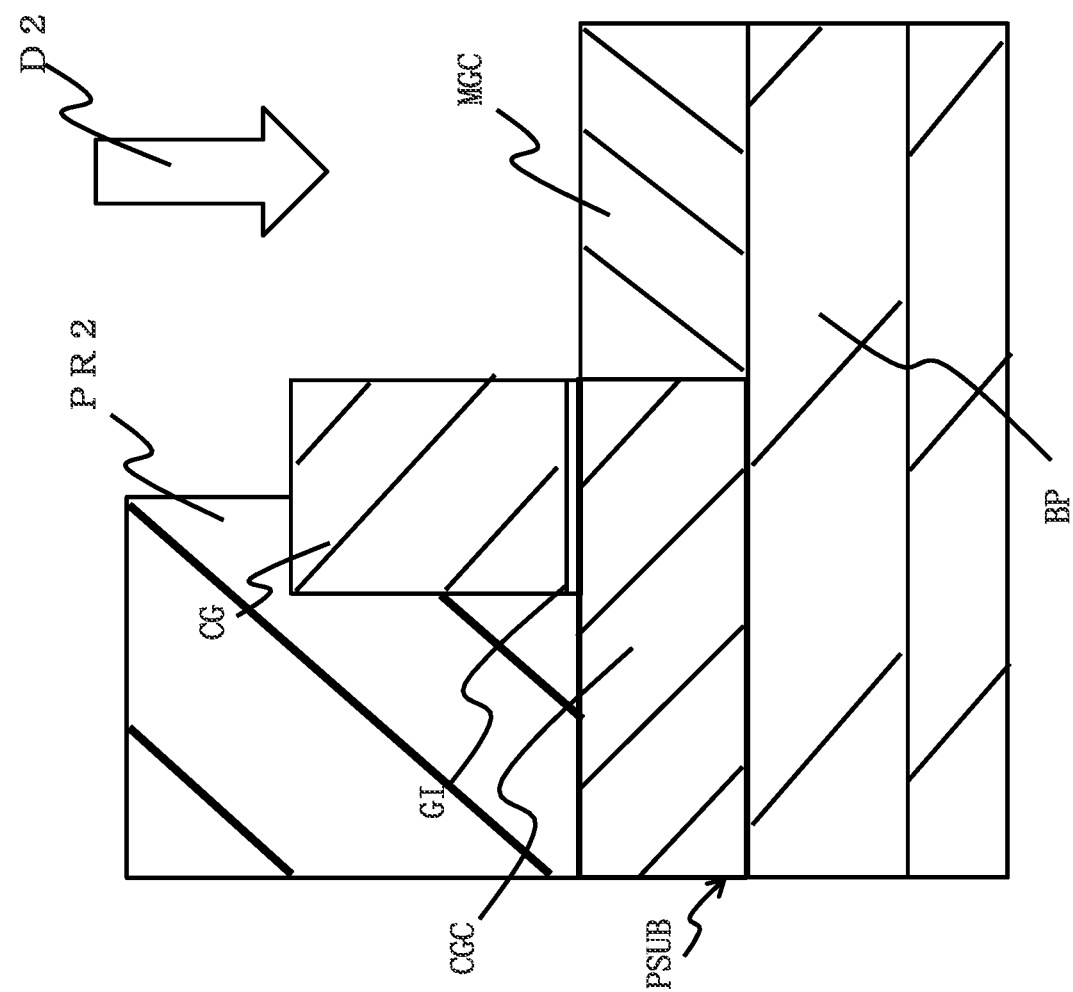
FIG. 11A is a cross-sectional view showing a principal part in the manufacturing process of the split-gate type MONOS using the FinFET following FIG. 10A.

Next, as shown in FIG. 11A, after the photoresist mask PR1 is removed, a photoresist mask PR2 is formed so as to cover the regions to be the control gate CG and the drain SR, and phosphorus is ion-implanted into the main surface of the semiconductor substrate from the vertical direction D2 with using the control gate CG and the photoresist mask PR2 as a mask, thereby forming the n-type channel MGC with an impurity concentration of $1 \times 10^{18}$ cm$^{-3}$.

Next, after removing the photoresist film PR2, a silicon oxide film, a silicon nitride film, and a silicon oxide film are sequentially stacked on the upper surface of the semiconductor substrate PSUB including the upper surface of the control gate electrode CG, thereby forming the charge trapping insulating film.

Figure 12B:
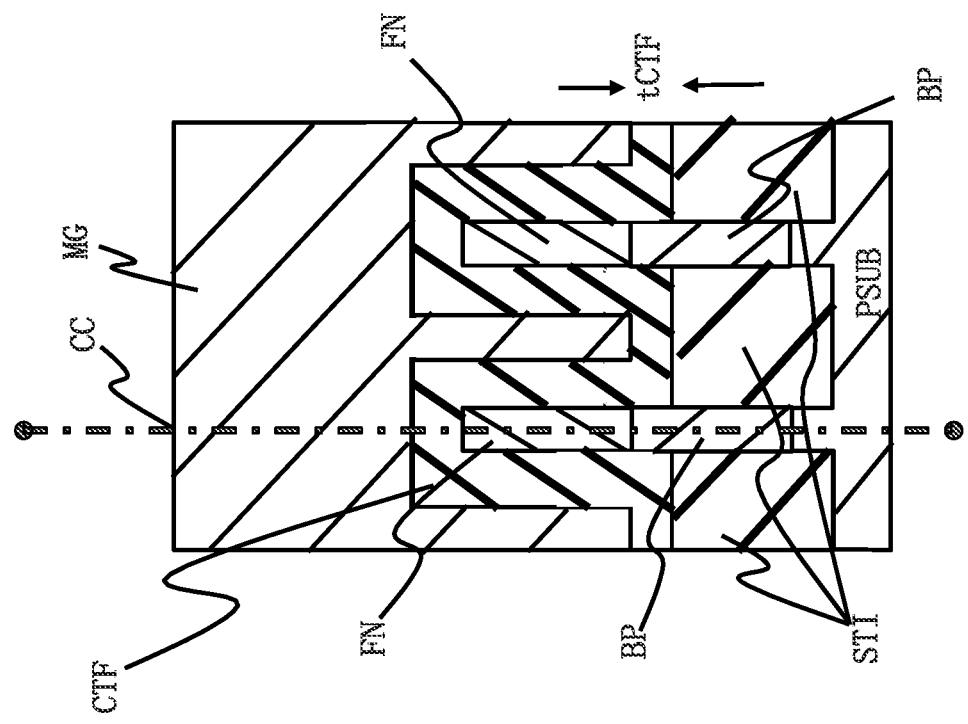
FIG. 12B is a cross-sectional view showing a principal part in the manufacturing process of the split-gate type MONOS using the FinFET following FIG. 11B.

Next, a polycrystalline silicon film in which phosphorus is doped at a high concentration is deposited on the charge trapping insulating film, and the anisotropic etching is performed to the polycrystalline silicon film, thereby forming the memory gate MG on the side surface of the control gate CG as shown in FIG. 12A and FIG. 12B. Thereafter, the charge trapping insulating film exposed from the control gate CG and the memory gate MG is selectively removed by etching, thereby forming the charge trapping film CTF so as to be left under the memory gate MG and between the control gate CG and the memory gate MG. The charge trapping film CTF is formed of a silicon oxide film having a thickness of about 3 nm formed by the thermal oxidation, a silicon nitride film and a silicon oxide film having a thickness of about 6 nm formed by the CVD method.

By the anisotropic etching of the polycrystalline silicon film described above, the polycrystalline silicon film having a sidewall shape is left on the side surface of the control gate CG on the opposite side of the memory gate MG, but the left polycrystalline silicon film is removed by the selective etching process.

Next, arsenic is ion-implanted into the main surface of the semiconductor substrate with using the control gate CG and the memory gate MG as a mask, thereby forming the n-type source SR and the n-type drain DR having an impurity concentration higher than the impurity concentration of the channel MGC. The basic structure of the semiconductor device according to the first embodiment is formed by the manufacturing method described above. Thereafter, for the electrical connection to the drain DR, a bit line contact BLC shown in FIG. 4 is opened. Here, the bit line contact BLC does not appear in the cross section shown in the drawing, and thus the illustration thereof is omitted.

Figure 13A:
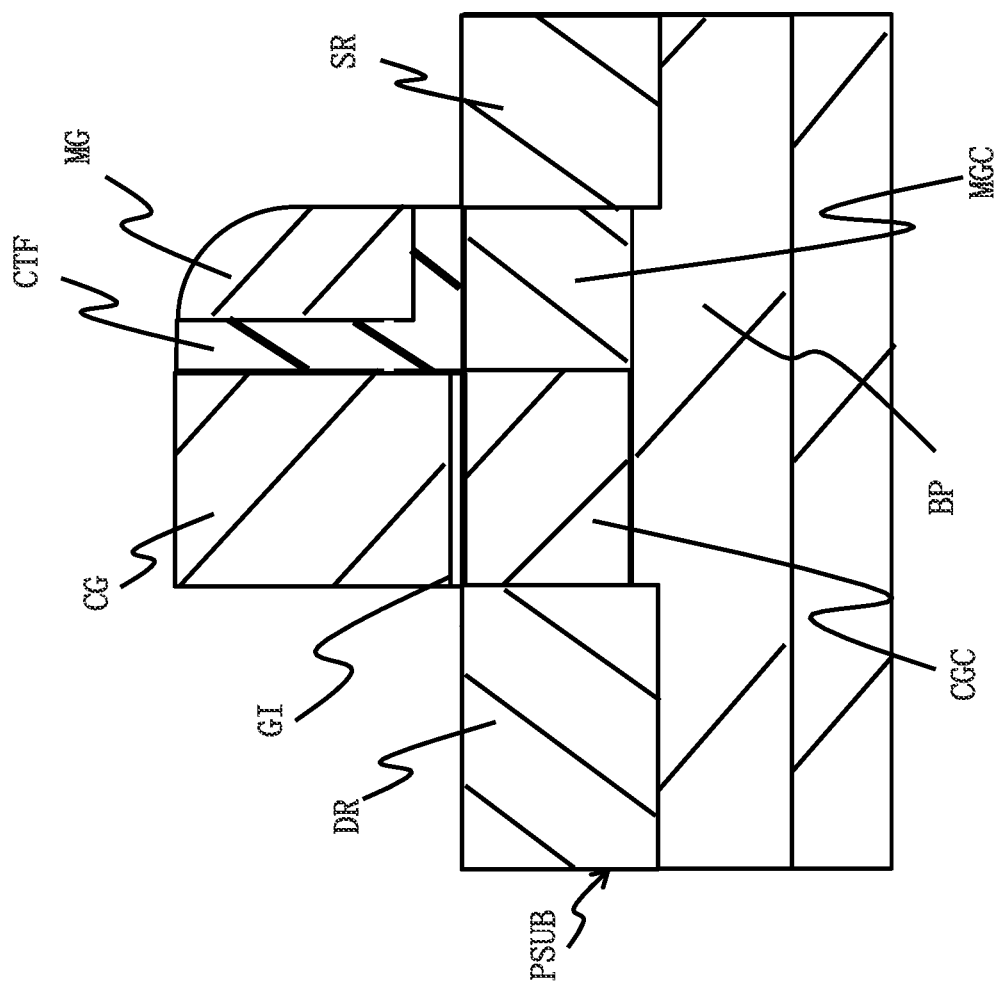
FIG. 13A is a cross-sectional view showing a principal part in the manufacturing process of the split-gate type MONOS using the FinFET following FIG. 12A.
Figure 13B:
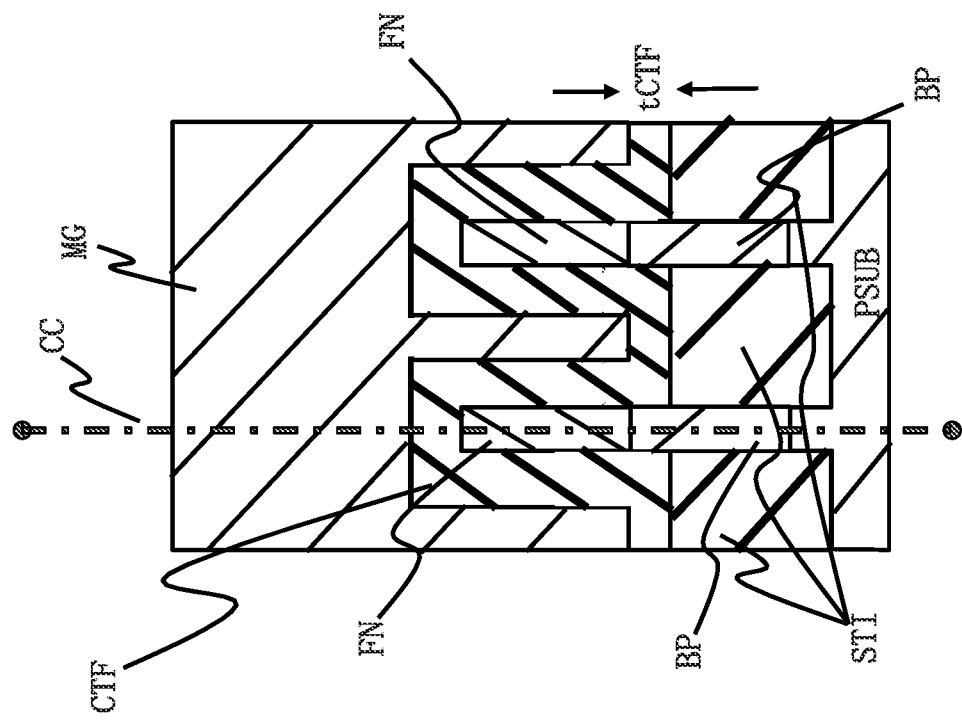
FIG. 13B is a cross-sectional view showing a principal part in the manufacturing process of the split-gate type MONOS using the FinFET following FIG. 12B.

Further, after the structure shown in FIG. 13A and FIG. 13B is completed, a tungsten film is deposited on the entire surface of the semiconductor substrate PSUB, and the tungsten film is planarized by the CMP method. At that time, by planarizing the upper surfaces of the memory gate MG and the control gate CG at the same time, it is possible to prevent the memory array portion from being higher than other outer peripheral regions and the like.

Thereafter, though not shown, an oxide film to be an interlayer insulating film is deposited to about 200 nm on the entire surface of the semiconductor substrate PSUB, and a normal wiring process for forming the wiring formed of a copper film or an aluminum film is performed, thereby forming the wiring of the memory cell array and the peripheral circuit.

Further, as shown in FIG. 13B, the structure in which the upper surface position of the p-type semiconductor layer BP protrudes from the shallow trench isolation STI by a film thickness tCTF of the charge trapping film CTF is formed. In this manner, the preferable channel controllability can be obtained. For example, when the film thickness of the charge trapping film CTF is 20 nm, the p-type semiconductor layer BP is formed up to the position of 20 nm from the lower end of the fin FN (upper surface of the shallow trench isolation STI).

In addition, since the memory gate MG that controls the fin FN in the horizontal direction is not arranged in the film thickness region of the charge trapping film CTF, there is a risk that the controllability of the fin FN is deteriorated, but this risk can be avoided by arranging the p-type semiconductor layer BP.

As described above, the split-gate type MONOS structure of the semiconductor device according to the first embodiment can be formed. In the manufacturing process described above, an n-type impurity is doped into the channel forming layer MGC, and the memory cell MC that operates in the accumulation mode can be obtained. Consequently, the memory cell MC having excellent writing characteristics can be obtained. Further, the p-type semiconductor layer BP is formed under the n-type channel MGC, and the memory operation can be performed without deteriorating the controllability by the memory gate MG.

Figure 16:
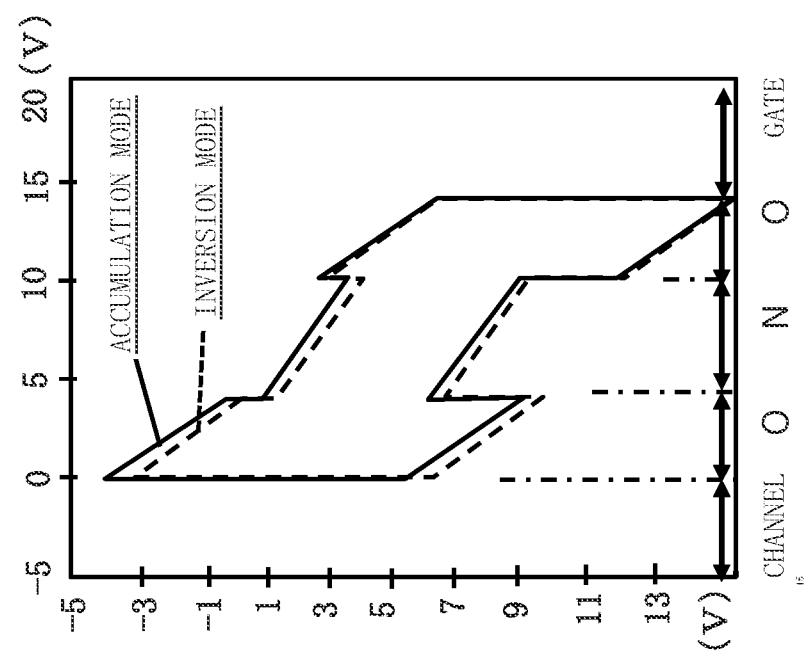
FIG. 16 is a potential distribution diagram showing a potential distribution comparison at the same gate bias between an accumulation mode and an inversion mode in the split-gate type MONOS using the FinFET according to the embodiment.

Also, in the split-gate type MONOS structure according to the first embodiment, the PN junction is formed at the boundary between the channel forming layer MGC and the channel forming layer CGC. FIG. 16 schematically shows the potential distribution in the charge trapping film CTF (stacked film of oxide film O/nitride film N/oxide film O) in the vicinity of the PN junction. Note that the solid line in FIG. 16 indicates the accumulation mode and the dotted line indicates the inversion mode. Since the impurity type of the channel changes from the p-type to the n-type in the vicinity of the PN junction, the potential difference of about 1 V occurs for the same gate voltage. Therefore, the gate voltage required for giving the same vertical electric field to the channel can be lowered. In addition, since this difference is concentrated to the vicinity of the PN junction, the high hot carrier generation efficiency can be obtained.

(Modification)

Figure 14:
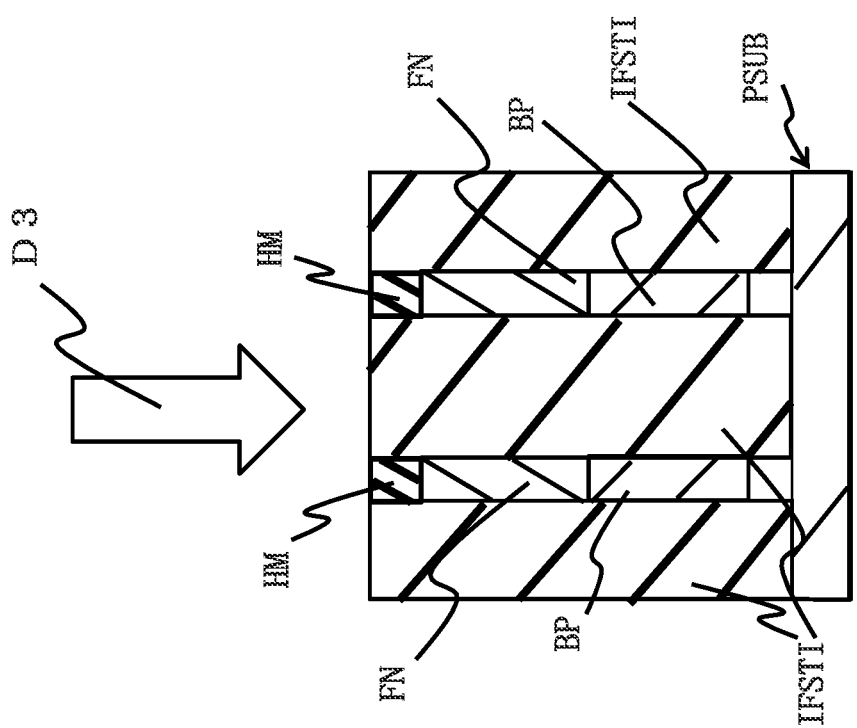
FIG. 14 is a cross-sectional view showing a principal part in a modification of the manufacturing process of the split-gate type MONOS using the FinFET according to the embodiment.

In the first embodiment above, the process of forming the p-type semiconductor layer BP at the lower portion of the fin FN before forming the fin FN has been described. Alternatively, it is also possible to form the p-type semiconductor layer BP at the desired position of the fin FN by performing the ion implantation of the p-type impurity after forming the fin FN. By this method, the thermal load after the ion implantation can be reduced, and thus the formation of the p-type semiconductor layer BP is easy. For example, as shown in FIG. 14, in the state where the fin FN is processed using the hard mask HM and an insulating film IFSTI deposited in the process of forming the shallow trench isolation STI is then planarized, the ion implantation of a p-type impurity into the fin FN from the vertical direction D3 is performed, thereby forming the p-type semiconductor layer BP.

Figure 15:
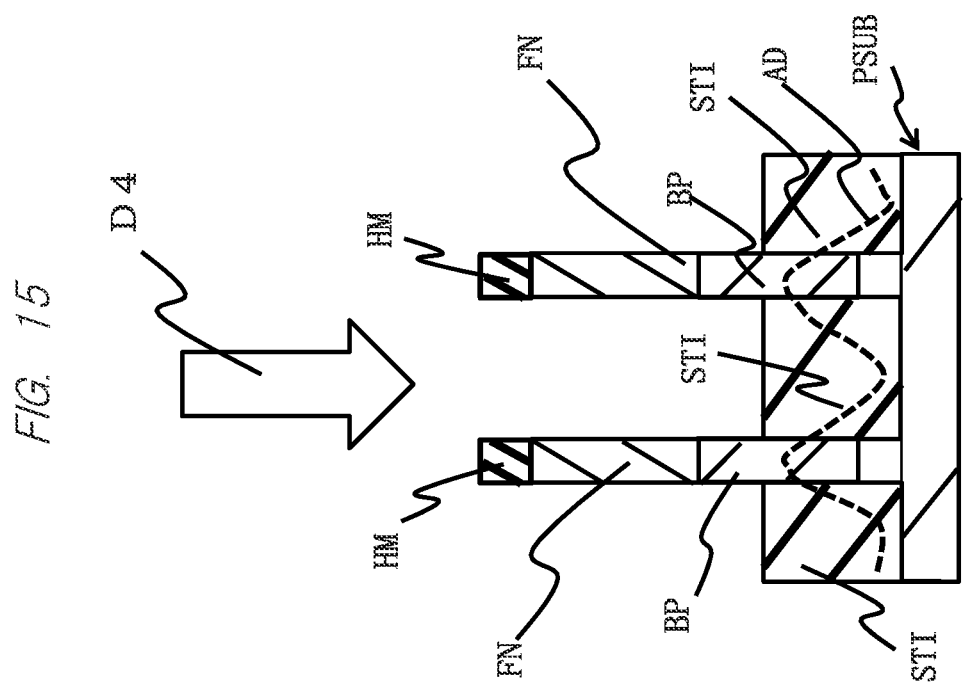
FIG. 15 is a cross-sectional view showing a principal part in a modification of the manufacturing process of the split-gate type MONOS using the FinFET according to the embodiment.

In addition, as shown in FIG. 15, in the state where the fin FN is formed and the etch back process for forming the shallow trench isolation STI is then finished, a p-type impurity is ion-implanted into the fin FN from the vertical direction D4, thereby forming the p-type semiconductor layer BP. The fin FN sandwiched between the memory gates MG is formed to have the height of 50 nm to 100 nm as a preferable example.

On the other hand, the fin FN buried in the shallow trench isolation STI is formed to have the depth of 200 nm to 300 nm. Therefore, even when the ion implantation for forming the p-type semiconductor layer BP is performed after forming the fin FN, the p-type semiconductor layer BP that actually contributes to the writing characteristics can be formed at the desired depth at the lower portion of the fin FN.

In the region without the fin FN, the ion-implanted p-type impurity can be retained in the oxide film of the shallow trench isolation STI, so that the characteristics of the semiconductor device are hardly affected. The average range in the ion implantation for forming the p-type semiconductor layer BP described above is indicated by the dotted line AD in FIG. 15.

In the foregoing, the invention made by the inventors has been specifically described based on the embodiment. However, the present invention is not limited to the above-described embodiment, and various modifications are possible within the range not departing from the gist thereof.

For example, in the first embodiment, the method in which the hot carrier injection to the charge trapping film is performed by the SSI and the BTBT (Band To Band Tunnel) in the split-gate type MONOS structure has been described. The charge injection into the charge trapping film can be performed in a different method, while using the same split-gate type MONOS structure.

Figure 18:
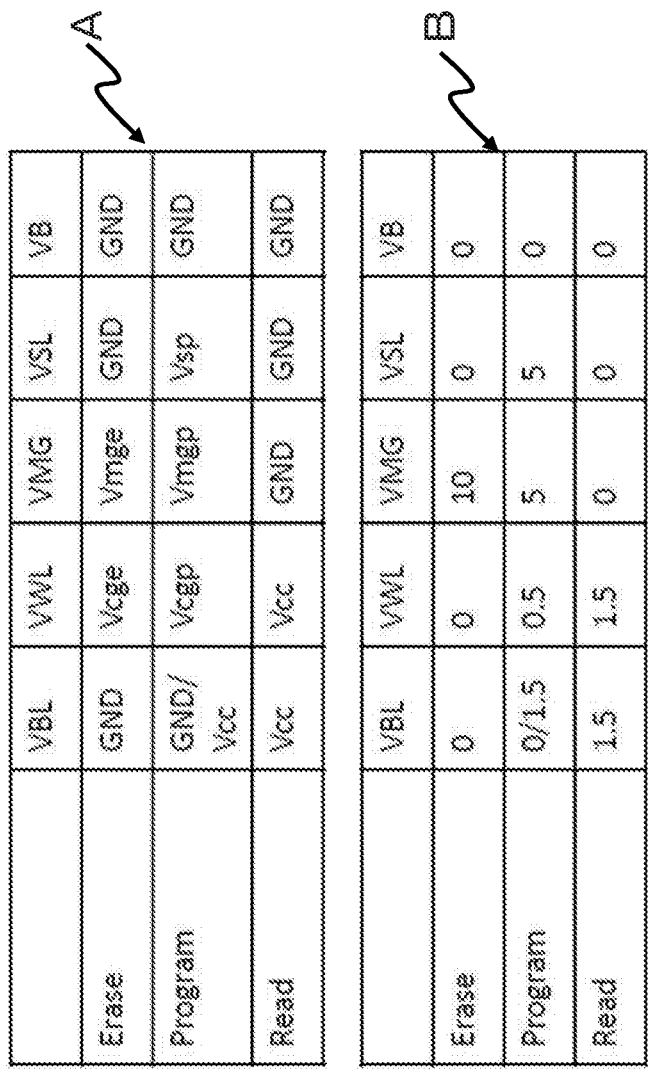
FIG. 18 is a bias condition diagram showing another example of the conditions of the bias applied during the operation of the split-gate type MONOS using the FinFET according to the embodiment.

For example, the electron injection in the writing is performed by the SSI injection like the first embodiment, but the hole injection into the charge trapping film is performed from the memory gate MG by using the tunnel injection in the erasing. FIG. 18 shows an example of the bias setting required in such a case. The bias setting is shown by signs such as a ground potential GND and a power supply voltage VCC in the upper table A of FIG. 18, and is shown by specific voltage (unit: V) examples in the device assuming the voltage of 1.5 V in the lower table B of FIG. 18. As shown in the lower table B, the hole injection is performed by the potential difference between gate and source in this operation method, but the operation in the accumulation mode can generate high electric field even in this case, and is thus effective for improving the erasing efficiency.

What is claimed is:

1. A semiconductor device having a split-gate type MONOS structure comprising:
   a semiconductor substrate having a main surface;
   a fin which is a part of the semiconductor substrate and is formed so as to selectively protrude from the main surface of the semiconductor substrate;
   an isolation which is formed on the main surface of the semiconductor substrate and is formed to have an upper surface located at a position lower than a position of an upper surface of the fin;
   a control gate which is formed so as to sandwich the fin via a gate insulating film formed on a surface of the fin;
   a memory gate which is formed so as to sandwich the fin via a charge trapping film formed on the surface of the fin and is arranged on a side surface of the control gate;
   a source which is formed in the fin located on one side surface of a split-gate structure configured of the control gate and the memory gate;
   a drain which is formed in the fin located on the other side surface of the split-gate structure;
   a first channel forming layer which is formed in the fin under the control gate and is formed of a p-type semiconductor layer; and
   a second channel forming layer which is formed in the fin under the memory gate and is formed of an n-type semiconductor layer.

2. The semiconductor device according to claim 1, wherein the first channel forming layer and the second channel forming layer form a PN junction at a boundary between the control gate and the memory gate.

3. The semiconductor device according to claim 1, wherein the fin is formed of an n-type semiconductor layer and an impurity concentration of the second channel forming layer is higher than an impurity concentration of the fin.

4. The semiconductor device according to claim 3, wherein the source and the drain are formed of an n-type semiconductor layer and the impurity concentration of the second channel forming layer is lower than impurity concentrations of the source and the drain.

5. The semiconductor device according to claim 1, wherein a transistor configured of the memory gate, the source, the drain, and the charge trapping film operates in an accumulation mode.

6. A semiconductor device having a split-gate type MONOS structure comprising:
   a semiconductor substrate having a main surface;
   a fin which is a part of the semiconductor substrate and is formed of an n-type semiconductor layer formed so as to selectively protrude from the main surface of the semiconductor substrate;
   an isolation which is formed on the main surface of the semiconductor substrate and is formed to have an upper surface located at a position lower than a position of an upper surface of the fin;
   a control gate which is formed so as to sandwich the fin via a gate insulating film formed on a surface of the fin;
   a memory gate which is formed so as to sandwich the fin via a charge trapping film formed on the surface of the fin and is arranged on a side surface of the control gate;
   a source which is formed in the fin located on one side surface of a split-gate structure configured of the control gate and the memory gate;
   a drain which is formed in the fin located on the other side surface of the split-gate structure;
   a first channel forming layer which is formed in the fin under the control gate and is formed of a p-type semiconductor layer;
   a second channel forming layer which is formed in the fin under the memory gate and is formed of an n-type semiconductor layer; and
   a p-type buried semiconductor layer which is formed on the main surface of the semiconductor substrate and is formed at a lower portion of the fin,
   wherein an impurity concentration of the buried semiconductor layer is higher than an impurity concentration of the first channel forming layer.

7. The semiconductor device according to claim 6,
   wherein an upper surface of the buried semiconductor layer is located higher than a surface of the isolation, and
   wherein the upper surface of the buried semiconductor layer is located higher than the surface of the isolation by a film thickness of the charge trapping film in a thickness direction of the semiconductor substrate.

8. The semiconductor device according to claim 6, wherein a transistor configured of the memory gate, the source, the drain, and the charge trapping film operates in an accumulation mode.

\* \* \* \* \*